INVENTOR
Bernard T. Murphy
BY Townsend and Townsend
attorneys

United States Patent Office 3,240,954

Patented Mar. 15, 1966

3,240,954

PULSE GATE

Bernard T. Murphy, Cupertino, Calif., assignor to William B. Hugle and Richard E. Lee, doing business as Hugle and Lee, Consultants, both of Sunnyvale, Calif.

Filed Dec. 20, 1962, Ser. No. 246,116

5 Claims. (Cl. 307—88.5)

This invention relates to a transistorized logic gate.

In the use of transistor logic gates there are several problems, one of which is the delay in response time in the higher operating ranges; another is that slight changes in the circuit element values may make the entire circuit inoperative; a third is that variations in temperature may substantially change the transistor operating characteristics and affect the circuit and a fourth is that the back circuit resistance or current drain can be a serious limitation.

In this invention there is provided a high speed logic gate in which a two stage transistor circuit is driven by logic signals to cause the second stage transistor to control an output logic gate. The input logic signals, which are amplified by the first transistor stage, drive the second transistor stage. Because of the signal amplification the second transistor stage turn on time is quite fast, and as a result, the output pulse time rise is quite sharp, being primarily dependent on the switching speed of the second stage transistor and not the first. If, however, either transistor stage was allowed to operate in the saturation range during switching, the pulse time fall would be delayed because of transistor carrier storage characteristics.

It is an object of this invention to provide a bias means for maintaining both transistor stages within their active operating range and far from their saturation operating range. This is accomplished by connecting a diode shunt loop between the first stage input terminal and the second stage output terminal so that a portion of the input signal is shunted from input stage when circuit operation exceeds a predetermined level. The transistors can thus be effectively maintained within their active operating ranges.

An advantage of keeping the transistor within the lower active operating range is that the response time can be minimized because of the reduction of transistor internal capacitive storage effect, thereby insuring a maximum pulse repetition rate for high speed switching operation.

A feature and advantage of this shunt loop resides in the fact that circuit component values are not critical because the transistors are maintained within their active operating ranges for a wide variey of values of circuit elements such as resistors, diodes and even one of the transistors. Because of this factor the circuit combination of this invention is particularly well suited for microminiaturized integrated circuit construction.

In the present invention there is lower current drain because a higher output current level will change the potential at the output terminal causing a greater portion of the input signal to be shunted from the input through the diode. The resulting decrease in input signal available to the transistors reduces the operating level of the transistor stages and lowers the point of equilibrium operation. This is also an advantage since output load isolation or compensation is obtained.

It is another object of this invention to provide a pulse circuit having high speed switching characteristics in which only the output stage transistor need have high speed switching characteristics. This allows the input stage transistor to be readily replaced and substituted for without affecting the high speed switching characteristics.

Other objects and advantages of this invention will become apparent upon reading the following detailed description and enclosed drawing in which.

There is provided generally a diode "AND" gate in which input pulses simultaneously applied to all three input terminals will back bias each of the parallel diodes and decrease current flow through B+ voltage dropping resistor $R_1$. As a result, the potential at input junction *c* to the base terminal input stage transistor $T_1$ increases the base-emitter forward bias and in turn increases transistor $T_1$ collector-emitter current flow from B+ source through the collector and emitter leads. A portion of the increased emitter current flows through resistor $R_2$ resulting in forward bias of the emitter-base terminals of output stage transistor $T_2$. This forward bias rapidly increases the collector-emitter current, *Ic–Ie*, of transistor $T_2$.

A diode means $D_1$ is connected between the base of input stage transistor $T_1$ and the collector of output stage transistor $T_2$ for controlling the potential of the collector of output transistor $T_2$. As output current from transistor $T_2$ increases the potential at collector junction *f* decreases causing diode $D_1$ to become forward biased and accept a portion on the input signal at junction *c*.

The diode $D_1$ shunt path aids in maintaining transistors $T_1$ and $T_2$ within their active operating range by decreasing input current to the base of transistor $T_1$ when output current of transistor $T_2$ becomes too high. As a result the effects of upper operating range carrier storage in $T_2$ is eliminated. This produces an output pulse in which the trailing edge fall starts almost immediately after the input pulse is cut off.

Figure 1:
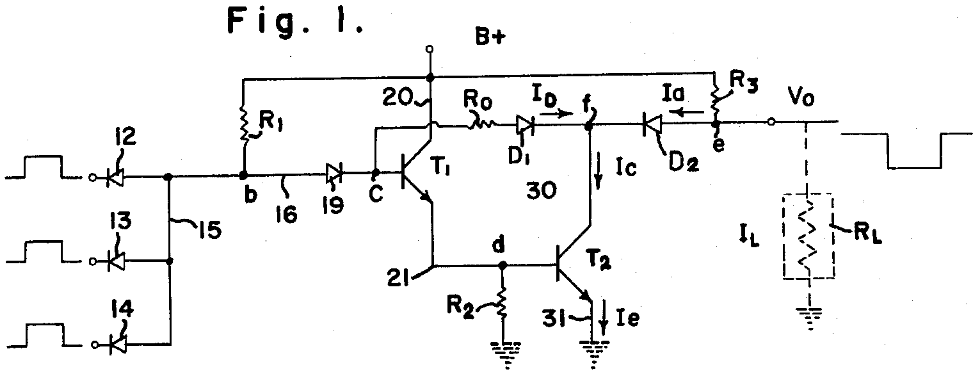
FIG. 1 is a schematic diagram of an embodiment of the pulse circuit of this invention.

Referring to FIG. 1, there is provided three gating diodes 12, 13 and 14 connected in parallel to a common lead 15. Under normal gate-off conditions, at least one of these diodes is forward biased and provides a path for current flow from B+ source through potential dropping resistor $R_1$. When positive pulses of sufficiently high potential are simultaneously applied to all three input terminals each of diodes 12, 13 and 14 is back biased to greatly increase the resistance in the path of current flow from B+ source. The increase in resistance decreases current flow through resistor $R_1$ and results in an increase in the potential at junction *b* and on lead 16. When junction *b* becomes more positive than base junction *c*, diode 19 is forward-biased and conducts. Since diode 19 has a low forward resistance, the potential at base junction *c* increases with the potential at junction *b*.

Any change in potential and current at base junction *c* controls input transistor $T_1$. Since input transistor $T_1$ is of the NPN type, any increase in base potential will forward bias the emitter-base terminals. This results in an increase in collector current flow from B+ source through lead 20 and emitter current flow through lead 21. By connecting input transistor $T_1$ with the collector lead 20 and emitter lead 21 as outputs, high current gain is attained.

The emitter current on lead 21 is divided between bias resistor $R_2$ and the base terminal of output transistor $T_2$. That portion of increased emitter current flowing through resistance leg $R_2$ increases the potential at junction *d*. This increase acts to increase the potential at the emitter terminal of input transistor $T_1$. Base-emitter terminal forward bias on input stage transistor $T_1$ is thereby reduced and in turn reduces the output current from input stage transistor $T_1$ to keep it within the lower operating range.

Any change in potential at junction *d* also controls the output current of output stage transistor $T_2$. An increase in potential will increase the forward bias on the base-emitter terminals of the NPN output transistor $T_2$. As a result an increased portion of the emitter current from input transistor $T_1$ becomes base current of output transistor $T_2$. The output current of transistor stage $T_2$ is increased correspondingly. Conversely, any decrease in forward bias causes a decrease in transistor output current.

Generally the output current of transistor $T_2$ comprises collector current I*c* from junction *f* on lead 30 to the transistor $T_2$ and emitter current I*e* from the transistor $T_2$ to ground on lead 31. This transistor output current forms a portion of the circuit output current $I_L$ through output impedance $R_L$ and any change will result in a change in output voltage across load impedance $R_L$.

Bias resistor $R_2$, which affects the turnoff switching speed and circuit power consumption, can be selected from a wide range of values. By selecting a low value for resistor $R_2$ the switching speed of output transistor $T_2$ is rapid, since the emitter-base forward bias tends to decrease rapidly. With a low value resistor $R_2$ the power dissipation will be high since the transistor $T_1$ operates at a higher range. If a high value resistor $R_2$ is used the turnoff switching speed will be slower since emitter-base forward bias does not decrease as rapidly, and power consumption will be lower since the operating range is lower. As a practical matter bias resistor $R_2$ has been set at 4500 ohms in one circuit. This value is high enough to provide a high potential at junction *d* to forward bias output transistor $T_2$ into conduction and low enough to shunt out the base of transistor $T_2$ when transistor $T_1$ is turned off.

The output signal from input stage transistor $T_1$ controls the switching of transistor $T_2$. Any low level input signal at junction *c* is greatly amplified by transistor $T_1$ and the amplified signal in turn increases the base current to output transistor $T_2$. With high level base current, output transistor $T_2$ quickly reaches the active operating range conduction level and, if output stage transistor $T_2$ has high speed characteristics, it can be seen that the time rise of the output pulse leading edge is nearly vertical. As a result the switching time of the circuit is not critically dependent on the switching speed characteristics of input transistor $T_1$. Therefore almost any NPN transistor can be used for $T_1$ without affecting the circuit operation.

Current flow $I_A$ through diode $D_2$ is controlled by the potential at junctions *e* and *f*. As long as the potential V*o* at output junction *e* remains higher than the potential at collector junction *f*, the diode is forward biased and will conduct. When output potential V*o* at junction *e* drops below the potential at junction *f*, diode $D_2$ is back biased and current $I_A$ is effectively cut off. As a result, output transistor $T_2$ collector current is greatly reduced resulting in a decrease in transistor current $I_e$–$I_c$. This decrease in transistor current causes the output potential V*o* at junction *e* to rise. When output potential V*o* rises to at least the potential at junction *f* or higher, diode $D_2$ is forward biased and again conducts current $I_A$. As a result the output pulse is clipped.

By providing a shunting path including diode $D_1$ and resistor $R_0$ between input transistor stage base junction *c* and output transistor stage collector junction *f*, the amount of input signal available to drive the circuit can be controlled by the operating level of the transistors. The potential at junction *f* is also clamped at a potential lower than the input potential to transistor $T_1$. Although a resistance $R_0$ has been shown connected in series circuit with diode $D_1$, it should be understood that it has a low impedance value or can, in many situations, be eliminated; that is, $R_0=0$ ohms. If a low value resistance $R_0$ is used any current conduction $I_D$ will cause a slight potential drop at junction *f* below the potential at input junction *c*.

When the potential at collector junction *f* is more positive than the potential at input junction *c*, diode $D_1$ is back biased and prevents current flow through the diode shunting path. During such back bias the potential at junction *f* is controlled by transistor $T_2$ current and can be more positive than the potential at junction *c*. During back bias of diode $D_1$ substantially all the current at junction *c* drives input stage transistor $T_1$ and the coupled output stage to a higher level.

When there is an increased current flow through the load impedance $R_L$ there is a drop in the potential of terminal *e* while increased transistor $T_2$ current flow I*e*–I*c* in turn results in a drop in the potential across the collector-emitter terminals of ouput transistor $T_2$. At such times as the potential at collector junction *f* decreases to the potential level at junction *c*, diode $D_1$ will conduct and, having a low forward resistance, maintain terminal *f* below the potential of terminal *c* but at a value which will hold $T_2$ out of the range of saturation thereby reducing the effect of carrier storage. Current $I_D$ which flows through shunting diode $D_1$ then forms part of collector current I*c* of output transistor $T_2$.

This diode shunting and clamping acts to keep output transistor $T_2$ within the active operating range. An input signal to transistor stage $T_1$ has two possible paths from junction *c*. If the potential at junction *c* is less positive than the potential at junction *f*, diode $D_1$ is back biased and almost all the current will act to drive transistor $T_1$, thereby increasing transistor stage $T_1$ collector-emitter current. If the input potential at junction *c* is more positive than the potential at junction *f*, diode $D_1$ is forward biased and the input current is passed toward junction *f*.

This division of current between one of the two paths prevents either of the transistors from being over driven. When input signal is applied to the base of input transistor $T_1$, there is a gain in the input stage emitter current. Emitter current flowing through bias resistor $R_2$ and base of the output stage transistor $T_2$ increases collector-emitter current—I*c* and I*e*. The increased load current decreases the potential at output junction *e* creating a negative going pulse V*o*. As output transistor $T_2$ conducts, the potential at collector junction *f* also becomes less positive.

When collector junction *f* becomes sufficiently low as a result of increased transistor $T_2$ current flow, clamping diode $D_1$ conducts. This, in effect, transfers a portion of input stage base current from junction *c* through resistor $R_0$ and diode $D_1$ to junction *f*. This current $I_D$ then becomes part of output transistor collector current I*c*. By so reducing the input current to input transistor $T_1$, transistor stage $T_1$ emitter current is reduced correspondingly. This in effect prevents input transistor $T_1$ from being over-driven or from over-driving output transistor $T_2$. An the coupled transistor $T_1$ and $T_2$ reach their point of equilibrium at a lower operating level.

Figure 2:
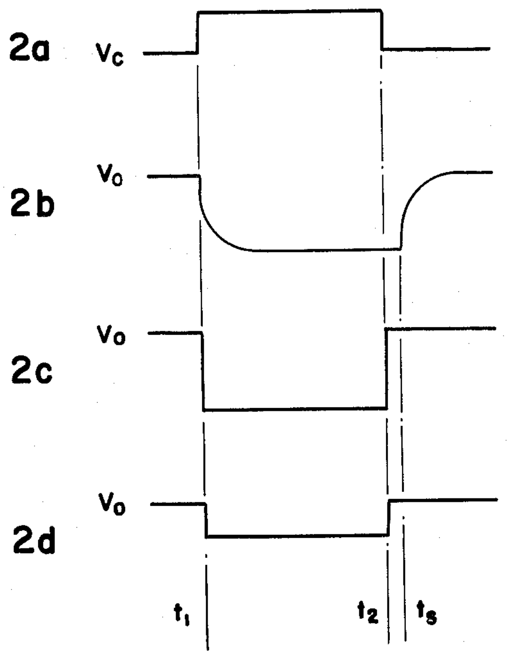
FIG. 2 is a timing chart of various output pulses with relation to the input pulse.

The input pulse $V_c$ (FIG. 2*a*) at junction *c* drives the pulse circuit. If either transistor $T_1$ or $T_2$ is allowed to operate in the saturated range, the distortion and the carrier storage characteristics of the semiconductor material would affect the output pulse shape. When the transistor is driven from the active linear range into the saturation range, the current gain for each increment of input current is decreased. This generally results in a rounded leading edge on the input pulse V*o* as indicated in FIG. 2*b*. When a saturated transistor is cut off, there is a slight time delay $t_s$ before the output pulse V*o* starts to fall. This is due to the carrier storage characteristics of the semiconductor material. When the pulse does fall, the fall time is also increased above optimum value, creating a pulse with a sloping, trailing edge.

A high output load impedance $R_L$ will cause a decrease in current gain and an increase in voltage output gain. This is illustrated by the pulse voltage curves in which FIG. 2*c* is illustrative of the output pulse *Vo* with a high level load. By decreasing the output load impedance $R_L$ the current gain increases and the voltage gain decreases to form an output pulse having a lower magnitude as indicated by FIG. 2*d*.

The input current division provides compensation for variations in load. For high load currents the input current will have to be higher. The increase in load current $I_L$ decreases the output voltage at terminal *f*. Rather than allow the transistor collector current *Ic* to increase to the point where the potential at collector terminal *f* will decrease to the saturation point, shunt path diode $D_1$ clamps junction *f* to a minimum potential. At this point, output transistor $T_2$ stabilizes.

An advantage of this circuit is that a wide range of values for junction terminal *f* potential will operate the circuit. These potentials should be high enough to keep output transistor $T_2$ out of saturation range and low enough to actuate the output load circuit $R_L$ connected at the output terminal *e*. Practical consideration dictates what this range and what the load is. It should, however, be noted that this circuit is compensated and operates at high speeds with a wide range of output load impedance because of the current division characteristics.

In selecting the value of passive and active circuit components, we have already seen that clamping resistors $R_0$ can fall within a wide range from 0 ohms upwards and that bias resistor $R_2$ is not critical. The selection of a B+ resistor $R_1$ and $R_3$ can also be from a wide range and only require that they sufficiently bias transistor $T_1$ and $T_2$ for low level stable operation. As a practical matter, all the diodes should have fast switching characteristics. This will provide less switching delay within the circuit. However, it is only necessary that input diodes 12, 13 and 14, and clamping diode $D_1$, have fast response characteristics. A diode of this type is the FD 829.

Transistor $T_1$ can be of any NPN type and specific design or switching characteristics are not necessary. Transistor $T_2$ should have fast switching response time and can be a 2N708 or a 2N709.

The problem of obtaining precision circuit elements is eliminated in this circuit. Because of this allowable tolerance between circuit elements, this type of circuit is especially suitable for microminiaturized integrated circuitry.

It should be understood that this invention is described in its broader aspects and is not limited to specific examples herein illustrated and described. For example, the NPN type transistors could be replaced with PNP transistors by reversing the potential values. The following claims are drawn to cover changes and modifications within the spirit and scope of the invention.

What is claimed:

1. A pulse circuit comprising:
(a) a source of electrical power;
(b) input signal means;
(c) a first transistor having a collector terminal connected to said source of power, a base terminal connected to be driven by said input signal means, and an emitter terminal;
(d) a second transistor having a base terminal connected to the emitter terminal of the first transistor, an emitter terminal connected to a common terminal of said source of power, and a collector terminal;
(e) a diode connected between the base terminal of the first transistor and the collector terminal of the second transistor to conduct current only when the collector potential is lower than the input signal potential shunting a portion of input signal from the first transistor to lower the operating level of the circuit when a predetermined range is exceeded, an output load, and a diode having a first terminal connected to the collector of said second transistor and a second terminal connected to said source of power and the output load to lower the collector emitter current when the voltage at the collector of the second transistor is higher than at said load.

2. A high speed pulse gate comprising:
(a) a source of electrical power;
(b) input signal means including a plurality of input diodes and a first voltage dropping resistor connected at one end to the power source and at the other end to all of the input diode means in common, said diodes being operable to decrease current flow through the voltage dropping resistor when simultaneous input signals are applied to the unconnected ends of the input diodes;
(c) a first transistor and a second transistor each including a base terminal and two output terminals, first terminals of said two output terminals of each transistor being connected to the source of power, the base of the first transistor being coupled to the junction between the first voltage dropping resistor and the input diode means, a second one of the output terminals of said first transistor being connected to the base terminal of the second transistor, a load impedance, a second diode having one terminal connected to the source of power and to said load impedance and the opposite terminal connected to the second of the output terminals of the second transistor, said diode being polarized to lower current flow to the second transistor when the voltage at the load is less than at the second terminal of the second transistor, said first transistor being connected to amplify the signal from the input means and drive the second transistor;
(d) and shunt means including a diode connected at one end to the base of the first transistor and at the other end to the second one of the output terminals of the second transistor to conduct and pass a portion of the input signal away from the first transistor base to the output terminal of the second transistor when the current through the load impedance exceeds a predetermined range to operate the transistors at a low equilibrium level.

3. A logic gate circuit comprising a first transistor having a base electrode and collector and emitter electrodes, input signal means connected to the base of said first transistor, a second transistor having a base electrode and collector and emitter electrodes, means supplying operating current to the collector and emitter of said transistors, said first transistor collector and emitter electrodes coupled to drive the base of said second transistor, shunt means connected at one end to the base electrode of said first transistor and at the other end to an output terminal of the collector and emitter electrodes of said second transistor, said shunt means operative to shunt a portion of the input signal to the output terminal of said second transistor when the output signal exceeds a predetermined level, output means, and diode current limiting means connected from said current supply means and said output means to the output terminal of said second transistor, said diode current limiting means operative to reduce the operating current to said second transistor when the output voltage at said output means exceeds the voltage at the output terminal of said second transistor.

4. A logic gate according to claim 3 in which said shunt means comprises a diode operable to conduct only when the potential at the output terminal of said second transistor is lower than the potential appearing at the base of said first transistor, and said current limiting means comprises a diode operable to conduct only when the potential at the output means is higher than the voltage at the output terminal of said second transistor.

5. A logic gate according to claim 3 and wherein the collector terminal of both first transistors are supplied with positive potential and said shunt means is a diode connected to conduct current to the collector of said second transistor only when the collector is more negative than the base of said first transistor and said current limiting means is a diode connected to conduct current to the collector of said second transistor only when the collector is more negative than said output means.

References Cited by the Examiner

UNITED STATES PATENTS

| | | | |
|---|---|---|---|
| 2,935,626 | 5/1960 | MacSorley | 307—88.5 |
| 3,092,729 | 6/1963 | Cray | 307—88.5 |

FOREIGN PATENTS

| | | |
|---|---|---|
| 215,148 | 5/1957 | Australia. |

ARTHUR GAUSS, *Primary Examiner.*